(12) United States Patent
Hahn

(10) Patent No.: US 6,500,719 B1
(45) Date of Patent: Dec. 31, 2002

(54) METHOD OF MANUFACTURING A MOSFET OF AN ELEVATED SOURCE/DRAIN STRUCTURE WITH SEG IN FACET

(75) Inventor: Seung Ho Hahn, Ichon-Shi (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/722,032

(22) Filed: Nov. 27, 2000

(30) Foreign Application Priority Data

Dec. 28, 1999 (KR) ............................................. 99-63506

(51) Int. Cl.⁷ ........................ H01L 21/336; H01L 21/44
(52) U.S. Cl. ........................ 438/300; 438/303; 438/607
(58) Field of Search .................. 438/300, 303, 438/607

(56) References Cited

U.S. PATENT DOCUMENTS

| | | | |
|---|---|---|---|
| 4,728,623 A | 3/1988 | Lu et al. ........................ 437/52 |
| 4,738,937 A | 4/1988 | Parsons ........................ 437/180 |
| 4,918,029 A | 4/1990 | Kim ............................ 437/119 |
| 5,004,702 A | 4/1991 | Samata et al. ................. 437/57 |
| 5,030,583 A | 7/1991 | Beetz .......................... 437/39 |
| 5,032,538 A | 7/1991 | Bozler et al. ................. 437/83 |
| 5,045,494 A | 9/1991 | Choi et al. .................... 437/60 |
| 5,093,275 A | * 3/1992 | Tasch, Jr. et al. |
| 5,124,276 A | * 6/1992 | Samata et al. |
| 5,168,072 A | * 12/1992 | Moslehi |
| 5,213,990 A | * 5/1993 | Rodder et al. |
| 5,272,109 A | 12/1993 | Motoda ........................ 437/129 |
| 5,322,802 A | 6/1994 | Baliga et al. .................. 437/22 |
| 5,322,814 A | 6/1994 | Rouse et al. .................. 437/110 |
| 5,371,026 A | * 12/1994 | Hayden et al. |
| 5,378,652 A | 1/1995 | Samata et al. ................. 437/189 |
| 5,432,121 A | 7/1995 | Chan et al. ................... 437/95 |
| 5,435,856 A | 7/1995 | Rouse et al. .................. 136/225 |
| 5,494,837 A | 2/1996 | Subramanian et al. ......... 437/34 |
| 5,508,225 A | 4/1996 | Kadoiwa ...................... 437/129 |
| 5,567,652 A | 10/1996 | Nishio ......................... 437/200 |
| 5,599,724 A | 2/1997 | Yoshida ....................... 437/40 |
| 5,627,102 A | 5/1997 | Shinriki et al. ............... 437/192 |
| 5,633,201 A | 5/1997 | Choi ........................... 438/620 |
| 5,744,377 A | 4/1998 | Sekiguchi et al. ............. 438/674 |
| 5,773,350 A | 6/1998 | Herbert et al. ................ 438/364 |
| 5,804,470 A | 9/1998 | Wollesen ..................... 438/141 |
| 5,831,334 A | * 11/1998 | Prall et al. .................... 257/750 |
| 6,124,627 A | * 9/2000 | Rodder et al. ................. 438/300 |
| 6,187,641 B1 | * 12/2001 | Rodder et al. ................. 438/299 |

FOREIGN PATENT DOCUMENTS

| | | |
|---|---|---|
| JP | 54-158880 | 12/1979 |
| JP | 2-37745 | 2/1990 |
| JP | 2-260667 | 10/1990 |
| JP | 8-236728 | 9/1996 |
| JP | 10-107219 | 4/1998 |
| JP | 11-97519 | 4/1999 |

* cited by examiner

Primary Examiner—Richard Booth
Assistant Examiner—Ron Pompey

(57) ABSTRACT

There is disclosed a method of manufacturing a semiconductor device capable of preventing a facet profile generated at the time when an epitaxial silicon layer is formed. In order to accomplish the above object, the method of manufacturing a semiconductor device according to the present invention comprises a first step of forming a gate including a mask insulating film and a sidewall spacer insulating film on a silicon substrate; a second step of growing a first epitaxial silicon layer on the exposed silicon substrate; and a third step of selectively growing a second epitaxial silicon layer on a facet region, wherein a boundary layer (layer in which the flow of hydrogen gas is substantially 0) for the flow of hydrogen gas on the entire structure for which the second step is completed and wherein the temperature of the facet region formed at the edge portion on the gate side in the first epitaxial silicon layer is higher than the temperature of its neighboring first epitaxial silicon layer.

11 Claims, 8 Drawing Sheets

METHOD OF MANUFACTURING A MOSFET OF AN ELEVATED SOURCE/DRAIN STRUCTURE WITH SEG IN FACET

BACKGROUND OF THE INVENTION

1. Field of the Invention

The invention relates generally to a semiconductor technology, and more particularly to, a method of manufacturing a MOSFET of an elevated source/drain structure.

2. Description of the Prior Art

In order to improve the properties of a semiconductor device, a shallow source/drain junction is required. As the source/drain junction becomes shallower, however, there occurs a problem that a junction resistance is increased. In order to solve this problem, an elevated source/drain structure has been proposed.

Referring now to FIGS. 1A to 1E, a method of manufacturing a conventional MOSFET of an elevated source/drain structure will be explained.

In a method of manufacturing a conventional MOSFET of an elevated source/drain structure, a device separation film 11 is formed on a silicon substrate 10, and a gate oxide film 12, a conductive film for gate electrode 13 and a mask insulating film 14 are sequentially formed and are then patterned to form a gate, as shown in FIG. 1A.

Next, a sidewall spacer 15 is formed at the sidewall of the gate using an oxide film or a nitride film, as shown in FIG. 1B.

Then, an epitaxial silicon layer 16 is selectively formed on the exposed silicon substrate 10 by chemical vapor deposition (CVD) method, as shown in FIG. 1C.

Thereafter, impurity ion implantation is implemented for forming a source/a drain at the epitaxial silicon layer 16, as shown in FIG. 1D.

Next, annealing process for activating ions-implanted dopants is performed, as shown in FIG. 1E. Thus, the dopants are diffused into the silicon substrate 10 by a certain depth, thus forming a MOSFET of an elevated source/drain structure.

As mentioned above, conventionally, after the epitaxial silicon layer 16 of about 1000 Å is grown, a source/drain junction is formed by ion implantation and annealing process.

However, when the epitaxial silicon layer 16 is grown, the edge portion of the epitaxial silicon layer 16, that is, a facet region A is formed at {311} or {111} orientation plane.

Therefore, after diffusion process, the distribution of the dopants has a pocket shape B. This shape of dopant distribution obstructs prevention of short channel effect that is obtained by implementing a uniform and shallow junction being the greatest advantage in an elevated source/drain structure. Rather than, it causes a drain-induced barrier-lowering (DIBL) phenomenon by which electric filed generated at the drain region affects the source region and thus significantly degrades electric characteristic around the gate.

FIG. 2 is a photograph taken by a scanning electronic microscope (SEM) for explaining that a facet region is generated after an epitaxial silicon layer is grown.

As one solution to solve the above-mentioned problems, there has been proposed a method by which a secondary spacer is applied to improve a facet region, as shown in FIG. 3.

In concrete, a device separation film 31 is formed on a silicon substrate 30, and a gate oxide film 32, a conductive film for gate electrode 33 and a mask insulating film 34 are sequentially formed and are then patterned to form a gate.

Next, a first sidewall spacer 35 is formed at the sidewall of the gate using an oxide film or a nitride film. Then, an epitaxial silicon layer 36 is selectively grown on the exposed silicon substrate 30.

Thereafter, a second sidewall spacer 37 is formed using the nitride film or the oxide film. At this time, the second sidewall spacer 37 is formed to have a similar thickness to the width of the facet region, enough to cover the facet region generated at a portion neighboring to the first sidewall spacer 35.

Then, after impurity ion implantation is implemented for forming a source/a drain at the epitaxial silicon layer 36, annealing process for activating ions-implanted dopants is performed. Thus, the dopants are diffused into the silicon substrate 10 by a certain depth, thus forming a MOSFET of an elevated source/drain structure.

Though this method solves the problem that the distribution of dopants has a pocket shape, however, formation of the junction region around the gate is severely prohibited due to the second sidewall spacer 37, thus causing increased channel length. Therefore, there is a problem that it degrades the performance of a device in view of drain saturation current $I_{dsat}$ and trans-conductance (gm). Also, there is a problem that the total number of process is increased due to additional process for forming the second sidewall spacer 37 and the manufacture cost of a device is thus increased.

SUMMARY OF THE INVENTION

It is therefore an object of the present invention to provide a method of manufacturing a semiconductor device capable of preventing a fact profile generated at the time when an epitaxial silicon layer is formed.

In order to accomplish the above object, a method of manufacturing a semiconductor device according to the present invention is characterized in that it comprises a first step of forming a gate including a mask insulating film and a sidewall spacer insulating film on a silicon substrate; a second step of growing a first epitaxial silicon layer on the exposed silicon substrate; and a third step of selectively growing a second epitaxial silicon layer on a facet region, wherein a boundary layer (layer in which the flow of hydrogen gas is substantially 0) for the flow of hydrogen gas on the entire structure for which the second step is completed and wherein the temperature of the facet region formed at the edge portion on the gate side in the first epitaxial silicon layer is higher than the temperature of its neighboring first epitaxial silicon layer.

Preferably, a method of manufacturing a semiconductor device according to the present invention comprises a first step of forming a gate including a mask insulating film and a sidewall spacer insulating film on a silicon substrate; a second step of growing a first epitaxial silicon layer on the exposed silicon substrate; a third step of forming a thin oxide film along the surface of the first epitaxial silicon layer; and a four step of selectively growing a second epitaxial silicon layer on a region in which the oxide film is removed, while selectively removing the oxide film in the facet region, wherein a boundary layer (layer in which the flow of hydrogen gas is substantially 0) for the flow of hydrogen gas on the entire structure for which the third step is completed and wherein the temperature of the oxide film in the facet region formed at the edge portion on the gate side in the first epitaxial silicon layer is higher than the temperature of its neighboring oxide film.

Also, a method of manufacturing a semiconductor device according to the present invention comprises a first step of forming a gate including a mask insulating film and a sidewall spacer insulating film on a silicon substrate; a second step of growing a first epitaxial silicon layer on the exposed silicon substrate; a third step of forming a thin oxide film along the surface of the first epitaxial silicon layer; a fourth step of implementing hydrogen bake at the temperature of 750~850° C. to selectively remove the oxide film on the facet region formed at the edge portion on the gate of the first epitaxial silicon layer; and a fifth step of selectively growing a second epitaxial silicon layer on a region in which the oxide film is removed.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
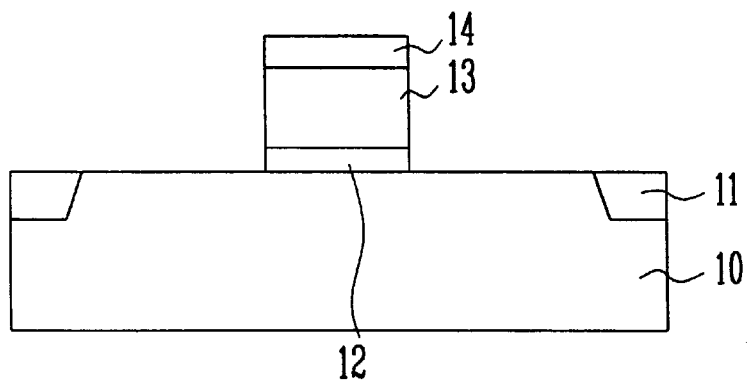
FIGS. 1A to 1E are cross-sectional views of a device for explaining a method of manufacturing a conventional MOSFET of an elevated source/drain structure.
Figure 1B:
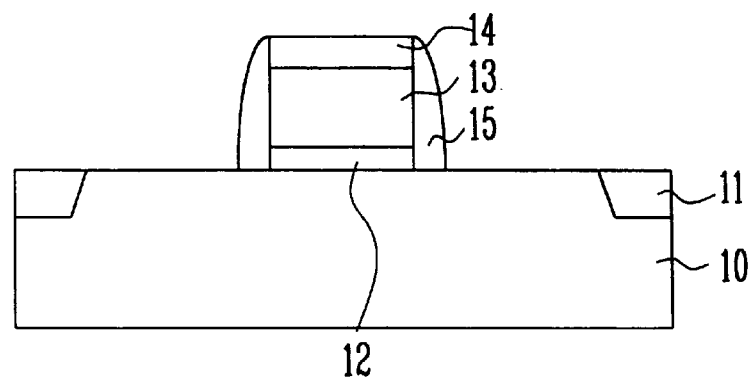
Figure 1C:
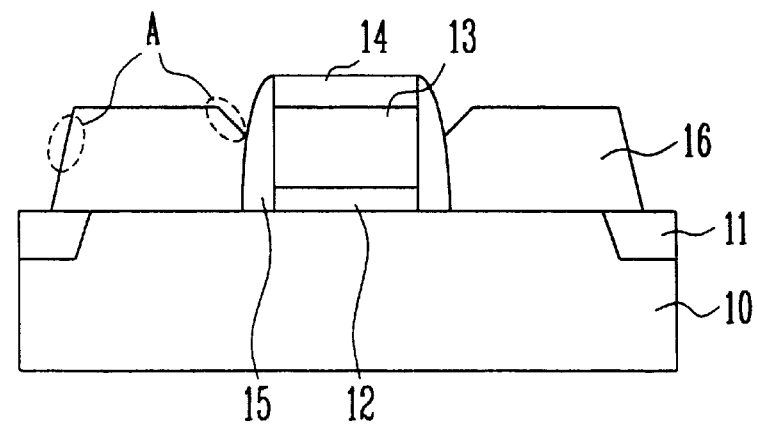
Figure 1D:
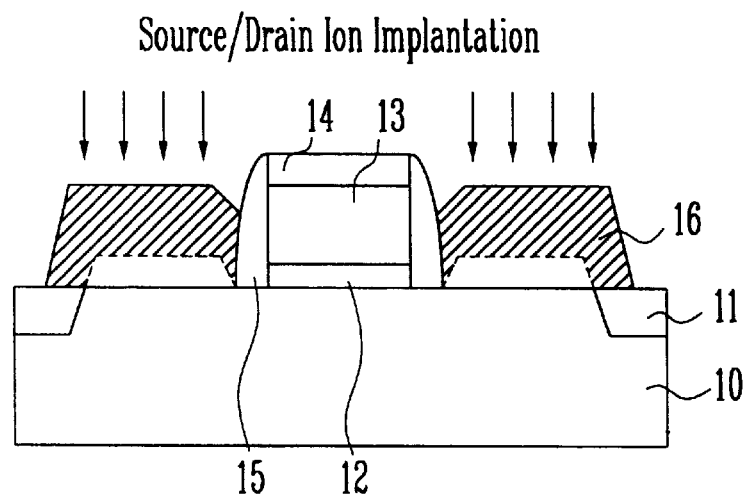
Figure 1E:
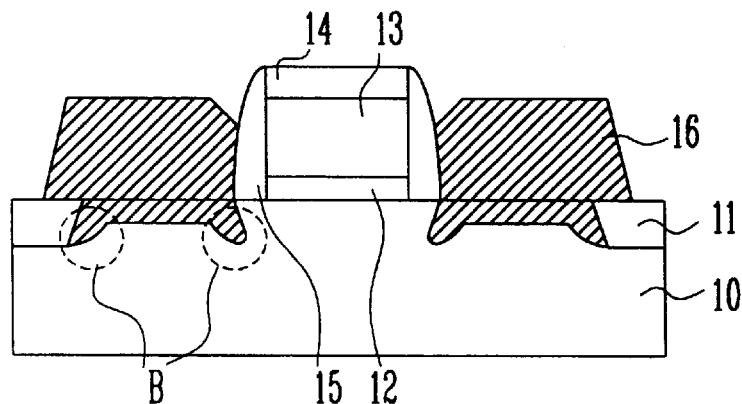
Figure 3:
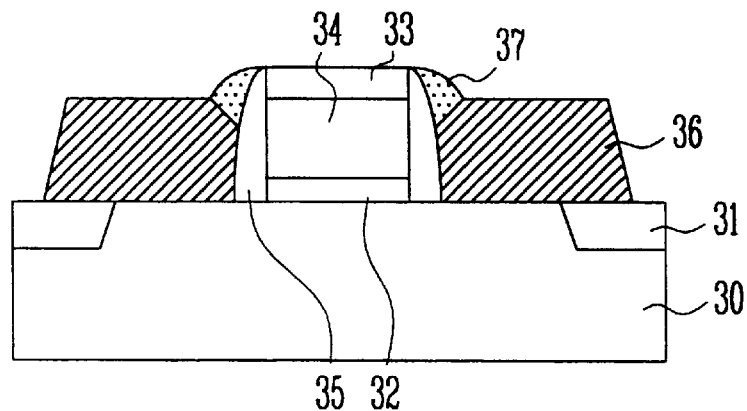
FIG. 3 is a cross-sectional view of a MOSFET of an elevated source/drain structure in which a facet region is improved by applying a spacer.
Figure 2:
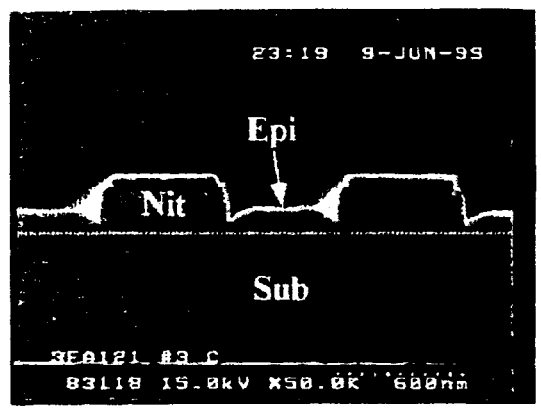
FIG. 2 is a photograph taken by a scanning electronic microscope (SEM) for explaining that a facet region is generated after an epitaxial silicon layer is grown.

The present invention will be described in detail by way of a preferred embodiment with reference to accompanying drawings, in which like reference numerals are used to identify the same or similar parts.

Referring now to FIGS. 4A to 4E, a method of manufacturing a MOSFET of an elevated source/drain structure according to one embodiment of the present invention will be explained.

Figure 4A:
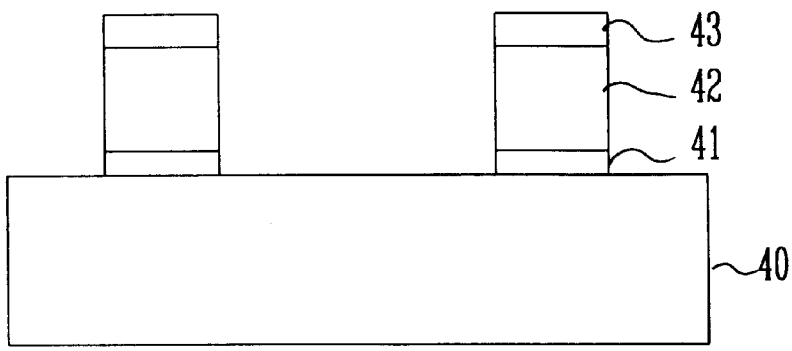
FIGS. 4A to 4E are cross-sectional views of a device for explaining a method of manufacturing a MOSFET of an elevated source/drain structure according to one embodiment of the present invention.

In a method of manufacturing a MOSFET of an elevated source/drain structure according to one embodiment of the present invention, a gate oxide film 41, a conductive film for gate electrode 42 and a mask insulating film 43 are sequentially formed on a silicon substrate 40 and are then patterned to form a gate, as shown in FIG. 4A.

Figure 4B:
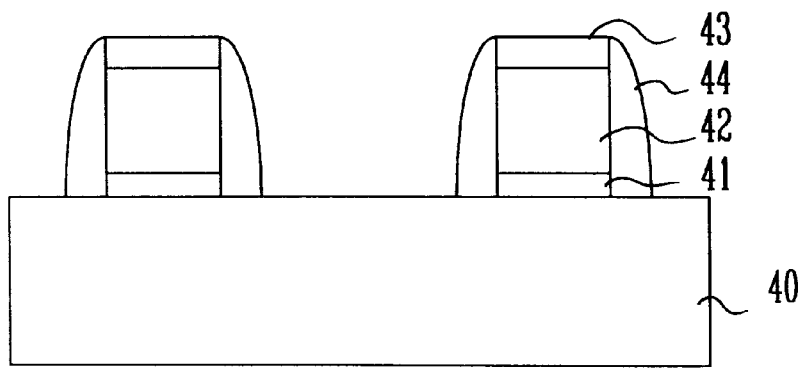

Next, a sidewall spacer 44 is formed at the sidewall of the gate using an oxide film or a nitride film, as shown in FIG. 4B.

Figure 4C:
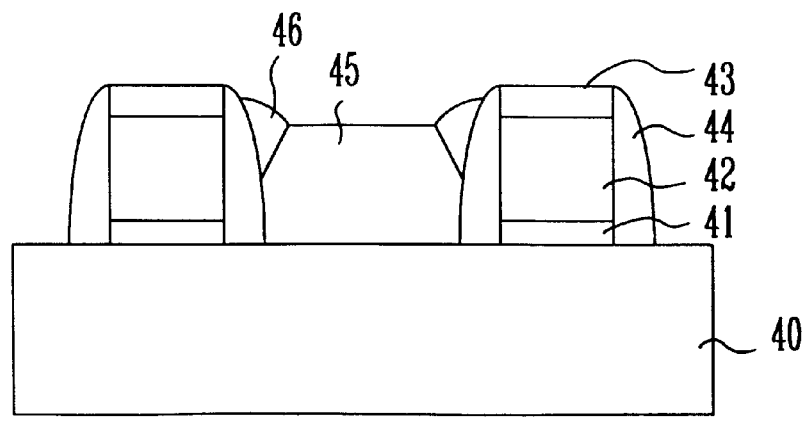

Then, a first epitaxial silicon layer 45 is selectively formed on the exposed silicon substrate 40 by low-pressure chemical vapor deposition (LPCVD) method, as shown in FIG. 4C. At this time, a facet region is generated at a portion neighboring to the gate. The deposition condition is as follows: a mixture gas of dichlorosilane (DCS) HCl is used as a source gas, the flow rate of DCS/HCl is 1.5~3, the flow amount of $H_2$ is 5~50 slm and the deposition pressure is 10~50 torr. Also, it is preferred that the deposition temperature is in the range of 750° C.~950° C.

Thereafter, a second epitaxial silicon layer 46 is formed in-situ selectively only at the facet region, the principle of which will be explained later in detail. At this time, the flow rate of DCS/HCl is 0.5~1.5, the flow amount of $H_2$ is 20~60 slm and the deposition pressure is 20~100 torr.

Figure 4D:
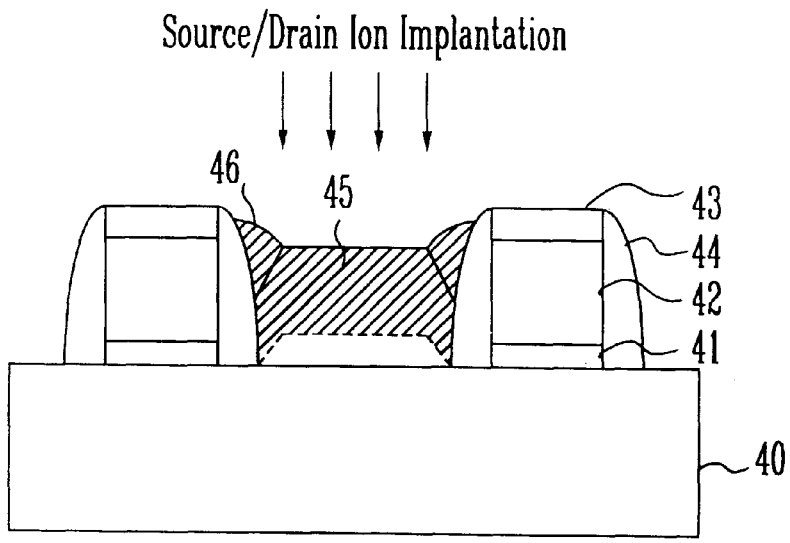

Next, impurity ion implantation is implemented for forming a source/a drain at the first and second epitaxial silicon layers 45 and 46, as shown in FIG. 4D.

Figure 4E:
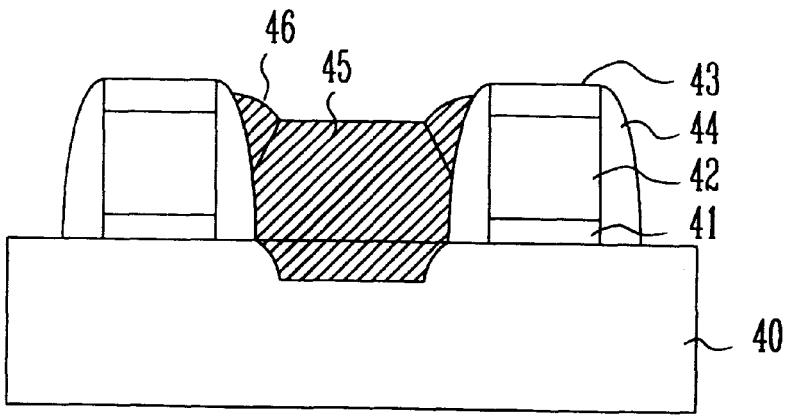

Then, annealing process for activating ions-implanted dopants is performed, as shown in FIG. 4E. Thus, the dopants are diffused into the silicon substrate 40 by a certain depth, thus forming a MOSFET of an elevated source/drain structure.

Here, explanation to the principle by which the second epitaxial silicon layer 46 is grown only at a facet region generated after the first epitaxial silicon layer 45 is formed, will be below explained in detail by reference to FIGS. 5A to 5C.

The theory of a boundary layer will be first explained in short. The theory of a boundary layer means that a layer having a constant physical value at a material of a low density facing to a material of a high density between a liquid phase and a solid phase, a gas phase and a solid phase or a gas phase and a liquid phase in a conventional dynamic region in which a deductive concept is established is created. Actually, it is mixed with a stagnant region having the difference below a constant value at a value on the surface of the material having a high density but its boundary value is differently defined depending on the case, which is usually about 0.2%.

The concept of the boundary layer used in the present invention relates to the distribution of temperature, in which the surface temperature of a wafer is represented at a system or a field that is greatly affected by fluctuations of hydrogen ($H_2$) gas introduced at room temperature, that is, a system or a field having greatly influenced by a convention current of thermal transfer mechanism.

Figure 5A:
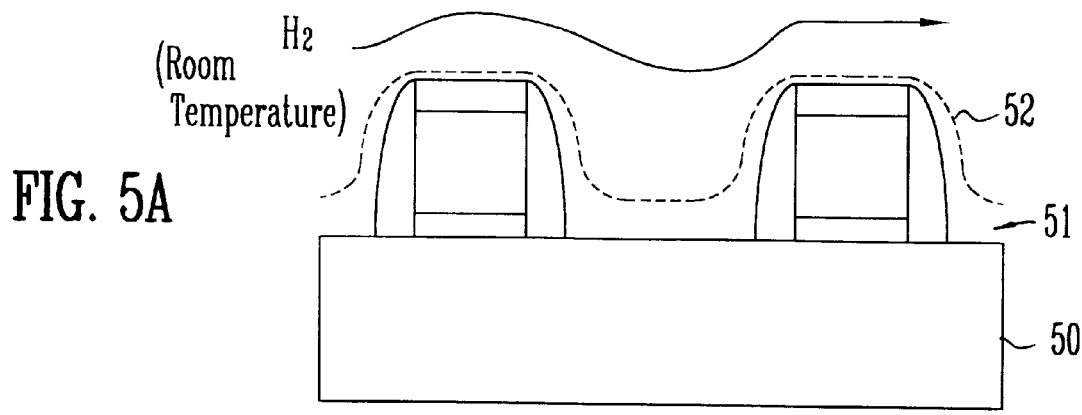
FIGS. 5A to 5C are diagrams for explaining the principle by which a second epitaxial silicon layer is grown only at a facet region generated after a first epitaxial silicon layer is formed.

First, as shown in FIG. 5A, the fluctuation of hydrogen ($H_2$) gas injected at the time when the epitaxial silicon layer is grown, reflect the profile on the silicon substrate 50 on which the gate 51 is formed. There is formed a boundary layer 52 the speed of which is nearly zero due to the speed of hydrogen ($H_2$) gas below the flow of the hydrogen ($H_2$) gas. In view of the temperature distribution at the boundary layer 52, phenomenon in which a streamline shape (flow of fluctuation) is reflected is occurred. In particular, during SEG, as the difference between the temperature of hydrogen ($H_2$) gas and that of the surface of the silicon substrate 50 is very great at room temperature, the flow of hydrogen ($H_2$) gas is adjusted to control the streamline shape. In other words, the boundary layer 52 represents a boundary in which epitaxial silicon can be grown rapidly, that, from 850° C.~900° C. in temperature. Therefore, the flow of hydrogen ($H_2$) gas is adjusted to control the boundary layer 52.

Meanwhile, the movement phenomenon within the gate 51 is generated at a rare thin region in which consecutive body mode is not applied, in which only a particle movement of a shape similar to a common fluctuation or a diffusion phenomenon is generated. Therefore, considering the general fluctuation and the fluctuation movement within the gate 51, as the surface of silicon is far from the boundary layer 52, the region represents a high temperature and the growth speed of the epitaxial silicon layer at that portion is relatively faster.

Figure 5B:
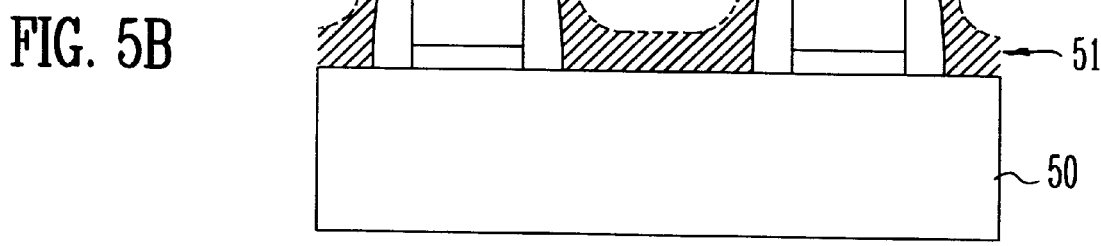

Referring now to FIG. 5B, there is shown the boundary layer 52 generated by the flow of the hydrogen ($H_2$) gas. From the drawing, it can be seen that growth of epitaxial silicon is generated only at the region 53 below the boundary layer 52.

Figure 5C:
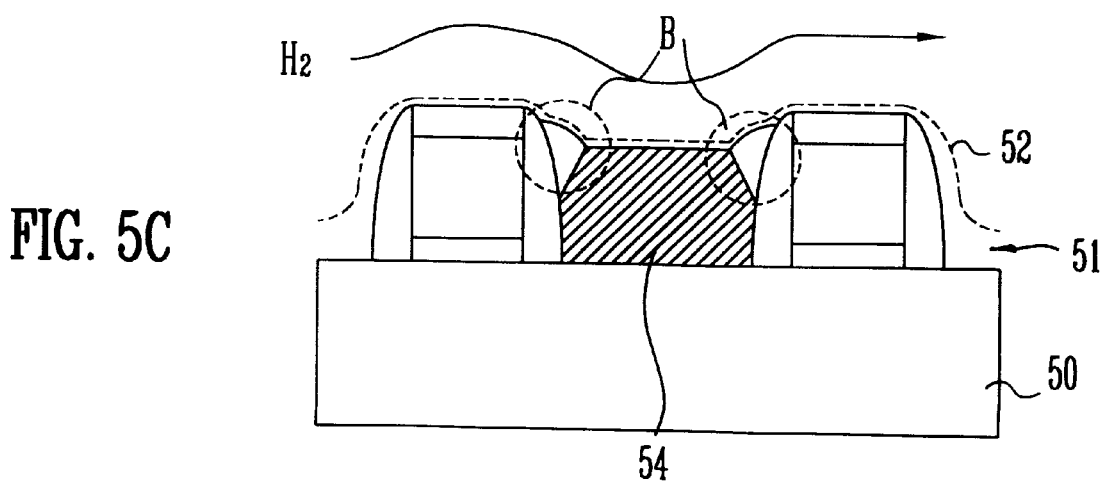

Next, FIG. 5C shows an epitaxial silicon layer 54 grown between the gate 51 according to a conventional method, and also shows the boundary layer 52 with respect to the temperature distribution depending on the flow of hydrogen ($H_2$) gas.

Figure 6:
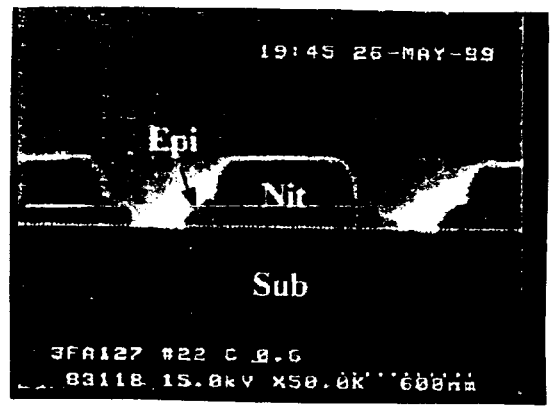
FIG. 6 is a photograph taken by SEM for explaining that an epitaxial silicon layer can be selectively formed only at a desired portion by controlling a boundary layer and a deposition gas.
Figure 7:
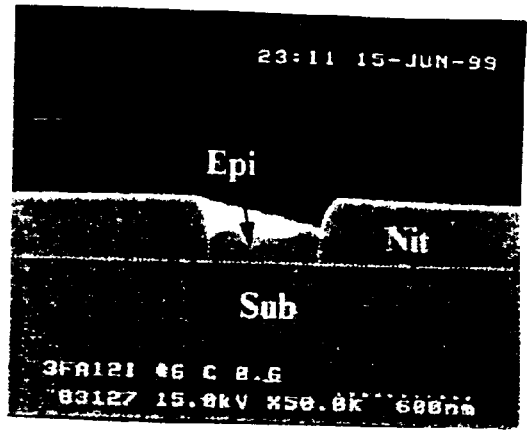
FIG. 7 is a photograph taken by SEM for explaining the result of the embodiment of the present invention.

FIG. 6 is a photograph taken by SEM for explaining that the epitaxial silicon layer can be selectively formed only at a desired portion by controlling the boundary layer and the deposition gas, in implementing the present invention. From the drawing, it could be seen that the epitaxial silicon layer is selectively formed only at the bottom sidewall of the gate and on the exposed silicon substrate. Also, FIG. 7 is a photograph taken by SEM for explaining the result of the embodiment of the present invention.

As such, the present embodiment can grow an additional epitaxial silicon layer selectively on a facet region generated after the epitaxial silicon layer is grown, thus removing the facet region. To do this, the present invention controls the amount and speed of hydrogen ($H_2$) gas used when epitaxial silicon is grown in order to change the shape of the boundary layer generated the flow of hydrogen ($H_2$) gas, as mentioned above, so that an additional epitaxial silicon layer can be selectively grown only at a facet region neighboring to the gate.

Therefore, in the present invention, as the facet region is removed by using silicon not containing different type of materials unlike the conventional method, the distribution of the source/drain dopants can be stabilized because degradation of DIL can be prevented and a stable ion implantation of doping can be implemented.

Referring now to FIGS. 8A to 8F, a method of manufacturing a MOSFET of an elevated source/drain structure according to another embodiment of the present invention will be below explained.

Figure 8A:
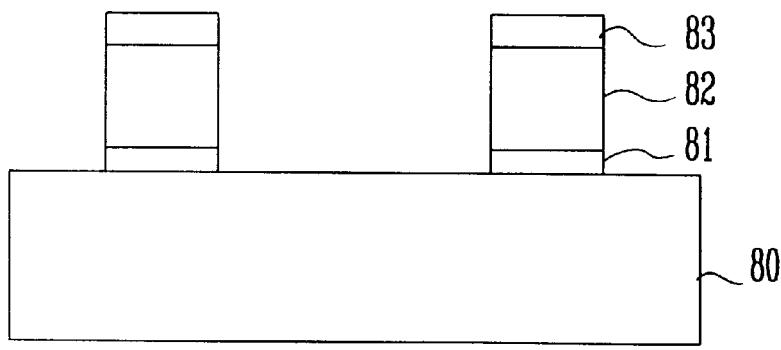
FIGS. 8A to 8F are cross-sectional views of a device for explaining a method of manufacturing a MOSFET of an elevated source/drain structure according to another embodiment of the present invention.

In a method of manufacturing a MOSFET of an elevated source/drain structure according to another embodiment of the present invention, a gate oxide film 81, a conductive film for gate electrode 82 and a mask insulating film 83 are sequentially formed on a silicon substrate 80 and are then patterned to form a gate, as shown in FIG. 8A.

Figure 8B:
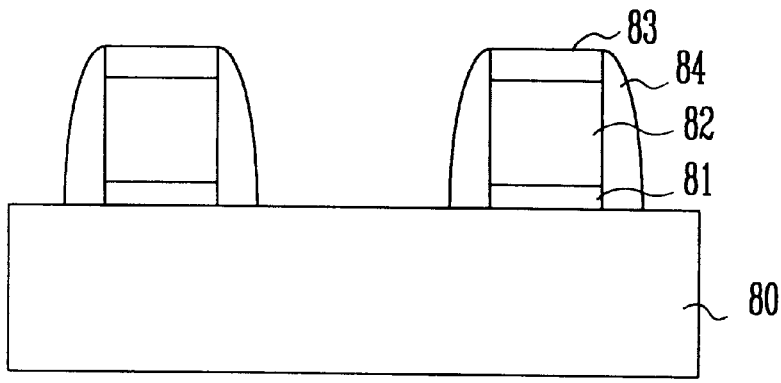

Next, a sidewall spacer 84 is formed at the sidewall of the gate using an oxide film or a nitride film, as shown in FIG. 8B.

Figure 8C:
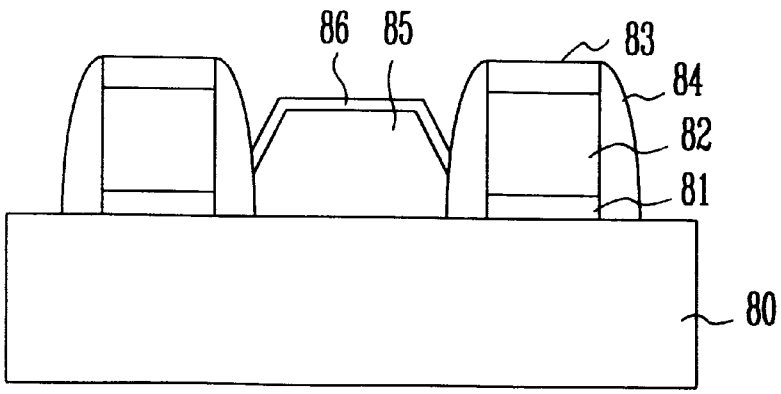

Then, a first epitaxial silicon layer 85 is selectively formed on the exposed silicon substrate 80 by low-pressure chemical vapor deposition (LPCVD) method, as shown in FIG. 8C. At this time, a facet region is generated at a portion neighboring to the gate. The deposition condition at this time is as follows: a mixture gas of dichlorosilane (DCS) and HCl is used as a source gas, the flow rate of DCS/HCl is 1.5~3, the flow amount of $H_2$ is 5~50 slm and the deposition pressure is 10~50 torr Thereafter, an oxide film 86 of below 20 Å is formed on the first epitaxial silicon layer 85 by leaving the silicon substrate 80 in the air or by artificial method or natural method through $NH_4OH$ cleansing.

Figure 8D:
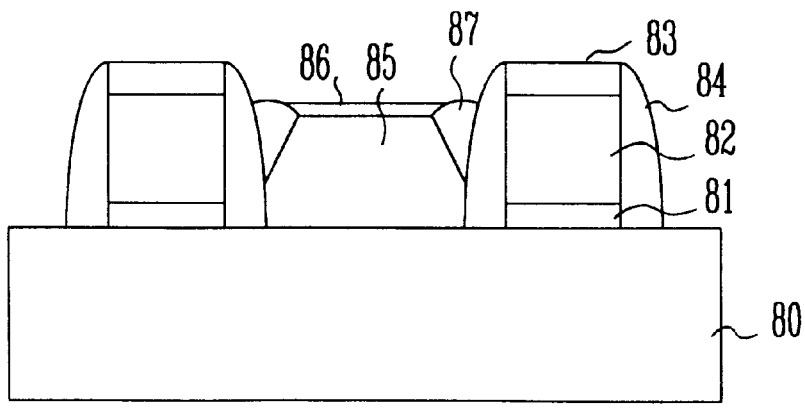

Next, only portions of the oxide film 86 located on the facet region generated at the time when the first epitaxial silicon layer 85 is formed is removed and the second epitaxial silicon layer 87 is left, as shown in FIG. 8D. Thus, the second epitaxial silicon layer 87 is formed at the facet region while not being formed on the left oxide film 86. At this time, the flow rate of DCS/HCl as deposition gases is 0.5~1.5, the flow amount of $H_2$ is 20~60 slm and the deposition pressure is set to 20~100 torr.

Here, explanation will be given two methods of removing the oxide film 86.

A first method is to deposit the second epitaxial silicon layer 87 simultaneously with removal of the oxide film 86 located on the facet region, while controlling the amount and speed of the of $H_2$ gas by the same method, as in FIG. 5C, based on the theory of a boundary layer mentioned above since the oxide film 86 is very shallowly formed below 20 Å.

Next, a second method is to remove the oxide film 86 located on the facet region to selectively grow the second epitaxial silicon layer 87, by hydrogen bake process at the temperature of 750~850° C. which is lower 30~50° C. than the temperature in the hydrogen bake process that is usually implemented at the temperature of 800~900° C. before the epitaxial silicon layer is formed in SEG process using LPCVD method.

Also, the first and second methods for selectively removing the oxide film 86 existing on the facet region utilizes the fact that the oxide film 86 existing on the facet region can be easily removed, since the temperature around the structure made of insulating materials among the structures formed on the silicon substrate 80 is relatively higher than that made of silicon, that is, since the temperature of the facet region formed near the gate spacer that can be called "made of an insulating material" is higher than its surrounding.

Figure 8E:
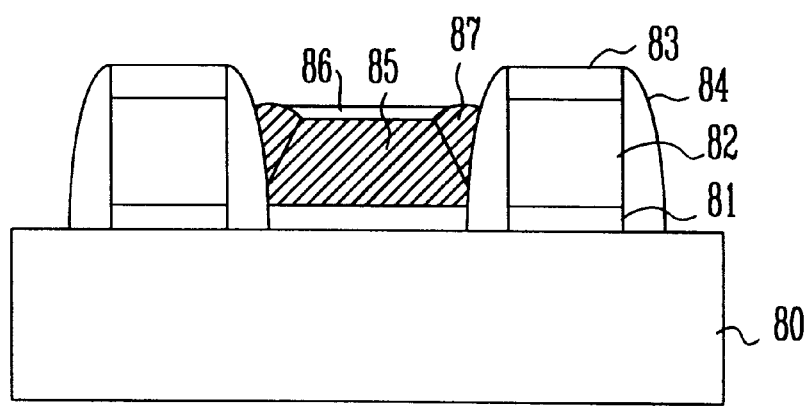

Then, impurity ion implantation is implemented for forming source/drain on the first and second epitaxial silicon layers 85 and 86, as shown in FIG. 8E.

Figure 8F:
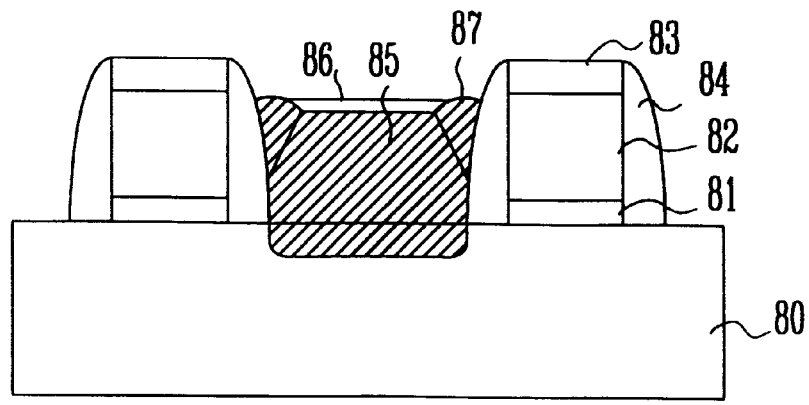

Next, annealing process for activating ions-implanted dopants is performed, as shown in FIG. 8F. Thus, the dopants are diffused into the silicon substrate 80 by a certain depth, thus forming a MOSFET of an elevated source/drain structure.

As mentioned above, the present invention has an effect that it can stabilize the distribution of source/drain dopants by removing facet regions generated at the time when epitaxial silicon is grown to form an elevated source/drain and thus improve the reliability of a device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising:

a first step of forming on a silicon substrate a gate comprising a mask insulating film and a sidewall spacer insulating film;

a second step of growing a first epitaxial silicon layer on an exposed area of said silicon substrate; and a third step of selectively growing a second epitaxial silicon layer on a facet region, said third step further comprising injecting hydrogen gas over the device, wherein said facet region is located in a boundary layer and at an edge portion of said gate and said first epitaxial silicon layer; said boundary layer comprises a layer wherein the flow of hydrogen gas is substantially nil; and a temperature of the facet region is higher than a temperature of the adjacent first epitaxial silicon layer.

2. The method of manufacturing a semiconductor device according to claim 1, wherein the growing of said first epitaxial silicon layer comprises low-pressure chemical vapor deposition comprising using a mixture of dichlorosilane (DCS) and HCl as a source gas, a flow rate of DCS/HCl of 1.5~3 slm, a flow amount of $H_2$ of 5~50 slm, a deposition pressure of 10~50 torr, and a temperature of 750~950° C.

3. The method of manufacturing a semiconductor device according to claim 1, wherein the growing of said second epitaxial silicon layer comprises using low-pressure chemical vapor deposition comprising using a mixture of dichlorosilane (DCS) and HCl as a source gas, a flow rate DCS/HCl of 1.5~3 slm, a flow amount of $H_2$ of 5~50 slm, a deposition pressure of 10~50 torr, and a temperature of 750~950° C.

4. A method of manufacturing a semiconductor device, comprising:

a first step of forming on a silicon substrate a gate comprising a mask insulating film and a sidewall spacer insulating film;

a second step of growing a first epitaxial silicon layer on an exposed area of said silicon substrate;

a third step of forming a thin oxide film along a surface of the first epitaxial silicon layer; and a fourth step of removing the thin oxide film in a facet region and selectively growing a second epitaxial silicon layer in the facet region, said fourth step further comprising flowing hydrogen gas over the device, and wherein the facet region is at an edge portion of the gate and the first epitaxial silicon layer; and a temperature of the oxide film in the facet region is higher than the temperature of the oxide film in an adjacent region.

5. The method of manufacturing a semiconductor device according to claim 4, wherein the growing of said first epitaxials silicon layer comprises low-pressure chemical vapor deposition comprising using a mixture of dichlorosilane (DCS) and HCl as a source gas, a flow rate of DCS/HCl of 1.5~3 slm, a flow amount of $H_2$ of 5~50 slm, a deposition pressure of 10~50 torr, and a temperature of 750~950° C.

6. The method of manufacturing a semiconductor device according to claim 4, wherein the growing of said second epitaxial silicon layer comprises low-pressure chemical vapor deposition comprising using a mixture of dichlorosilane (DCS) and HCl as a source gas, a flow rate of DCS/HCl of 1.5~3 slm, a flow amount of $H_2$ of 5~50 slm, a deposition pressure of 10~50 torr, and a temperature of 750~950° C.

7. The method of manufacturing a semiconductor device according to claim 4, wherein a thickness of said oxide film is less than 20 Å.

8. A method of manufacturing a semiconductor device, comprising:

a first step of forming on a silicon substrate a gate comprising a mask insulating film and a sidewall spacer insulating film;

a second step of growing a first epitaxial silicon layer on an exposed area of said silicon substrate;

a third step of forming a thin oxide film on a surface of the first epitaxial silicon layer;

a fourth step of implementing a hydrogen bake at a temperature of 750~850° C. to selectively remove the oxide film on a facet region formed at an edge portion on the gate of the first epitaxial silicon layer; and a fifth step of selectively growing a second epitaxial silicon layer on the region in which the oxide film is removed.

9. The method of manufacturing a semiconductor device according to claim 8, wherein the growing of said first epitaxial silicon layer comprises a low-pressure chemical vapor deposition method comprising using a mixture of dichlorosilane (DCS) and HCl as a source gas, a flow rate of DCS/HCl of 1.5~3 slm, a flow amount of $H_2$ of 5~50 slm, a deposition pressure of 10~50 torr, and a temperature of 750~950° C.

10. The method of manufacturing a semiconductor device according to claim 8, wherein the growing of said second epitaxial silicon layer comprises a low-pressure chemical vapor deposition method comprising using a mixture of dichlorosilane (DCS) and HCl as a source gas, a flow rate of DCS/HCl of 1.5~3 slm, a flow amount of $H_2$ of 5~50 slm, a deposition pressure of 10~50 torr, and a temperature of 750~950° C.

11. The method of manufacturing a semiconductor device according to claim 8, wherein a thickness of said oxide film is less than 20 Å.

* * * * *

UNITED STATES PATENT AND TRADEMARK OFFICE
CERTIFICATE OF CORRECTION

PATENT NO. : 6,500,719 B1
DATED : December 31, 2002
INVENTOR(S) : Seung Ho Hahn

It is certified that error appears in the above-identified patent and that said Letters Patent is hereby corrected as shown below:

<u>Title page, Item [54] and Column 1, line 3,</u>
After "STRUCTURE" delete "WITH SEG IN FACET".

<u>Title page,</u>
Underneath the *Assistant Examiner*, insert
-- [74] *Attorney, Agent, or Firm*—Finnegan, Henderson, Farabow, Garrett & Dunner, L.L.P. --

<u>Column 7,</u>
Line 48, "epitaxials" should read -- epitaxial --.

Signed and Sealed this

Twenty-sixth Day of August, 2003

JAMES E. ROGAN
*Director of the United States Patent and Trademark Office*